June 12, 1973 E. C. WILLIAMS 3,738,888

PROCESS FOR DISCRETE ELEMENT TRANSFER FROM A CONTINUOUS TAPE TO A DISCRETE SUBSTRATE

Filed June 2, 1970 3 Sheets-Sheet 1

INVENTOR:
EARL C. WILLIAMS,

BY Carl O. Thomas
HIS ATTORNEY.

INVENTOR:
EARL C. WILLIAMS,
BY Earl O. Thomas
HIS ATTORNEY.

INVENTOR:
EARL C. WILLIAMS,
BY Carl O. Thomas
HIS ATTORNEY.

United States Patent Office 3,738,888
Patented June 12, 1973

3,738,888

PROCESS FOR DISCRETE ELEMENT TRANSFER FROM A CONTINUOUS TAPE TO A DISCRETE SUBSTRATE

Earl C. Williams, Syracuse, N.Y., assignor to General Electric Company

Filed June 2, 1970, Ser. No. 42,682
Int. Cl. B32b *31/10;* C09j *5/02*
U.S. Cl. 156—238 7 Claims

ABSTRACT OF THE DISCLOSURE

A clamping unit compressively presses elements mounted on a continuous tape against an adhesive surface of a substrate at a bonding station and transports the substrate and tape together toward a stripping station. Synchronous feed and collection control rollers allow the tape to be held taut, yet free to move toward the stripping station. A drive arrangement for the synchronous rollers is provided to permit the desired tension to be maintained on the tape and to permit spaced loci on the tape to be aligned with the discrete substrates. A feed wheel incrementally advances substrates to the bonding station through a plurality of intermediate heat stations.

My invention relates to a method and apparatus for attaching elements to discrete substrates.

In manufacturing semiconductor devices it is conventional practice to utilize a slice of monocrystalline semiconductive material, typically referred to as a wafer, as a starting element for forming the electrically active portions of the devices. Typically the wafer is first processed to form one or more junctions therein. Thereafter the wafer is sub-divided to form a plurality of discrete semiconductive sub-units, or pellets. According to a conventional sub-dividing technique a wafer is adhesively bonded to a support such as a glass disc and is thereafter coated with a surface layer of adhesive material. A plurality of resist discs are then hand mounted in spaced relation over the surface of the wafer. A grit blast operation is performed which erodes away the portions of the wafer not protected by the resist discs. This forms a plurality of discrete sub-units or pellets which may be readily demounted from the support.

In the above process the hand mounting of the resist discs onto the wafer surface is particularly undesirable. As presently performed this is a manual operation which is both expensive and time consuming. Further, some care is required in placement of the resist discs. The discs must be laterally spaced from adjacent discs in order to allow the grit blast to cleave adjacent pellets. At the same time, however, the resist discs must be arranged in such a manner as to allow maximum possible utilization of the silicon consistent with the requirement of lateral spacing. The manner in which the discs are adhered to the wafer surface is also important. If a resist disc is only lightly placed on the adhesive coated surface of the wafer, it may be dislodged by the grit blast. What is less apparent is that the disc may also be dislodged by the grit blast if it is pressed against the wafer surface with too much force during mounting. The reason for this is that most of the adhesive may be displaced laterally from beneath the resist disc. Therefore the disc that initially seem to be securely anchored in position may rely for adherence to the wafer primarily on the adhesive which is laterally contiguous rather than there-beneath. The laterally adjacent adhesive is quickly eroded away during grit blast leaving the resist disc vulnerable to displacement.

It is an object of my invention to provide a process and an apparatus for quickly and efficiently mounting a plurality of elements to discrete substrates.

This and other objects of my invention may be accomplished in one aspect by an apparatus for transferring elements from spaced loci on an adhesive surface of a continuous tape to adhesive surfaces of discrete substrates. The apparatus is comprised of means for successively bringing the substrates to a bonding station. Means are provided for positioning a locus on the tape in alignment with a substrate at the bonding station. Means compressively associate the discrete substrate at the bonding station with at least one element associated with an aligned locus of the tape and advance the tape with the substrate attached to bring an additional locus into approximate alignment with the bonding station. Means are provided for successively stripping the substrates with the elements attached thereto from the tape, and means feed and collect the tape including means for maintaining a predetermined tautness of the tape between the bonding station and stripping means.

In another aspect the objects of my invention are accomplished by a process for mounting a plurality of elements to discrete substrates comprising mounting the elements at spaced loci along a continuous tape. The tape is positioned so that it is held taut yet free to move between a bonding station and a stripping station. A substrate is located at the bonding station. A locus on the tape is positioned in alignment with the substrate at the bonding station. The substrate is clamped into engagement with at least one element located at the aligned locus on the tape. The tape is laterally transported with the substrate clamped thereto away from the bonding station, and at least one element is stripped with the substrate attached from the tape.

My invention may be better understood by reference to the following detailed description considered in conjunction with the drawings, in which FIG. 1 is an isometric view of portions of my apparatus;

Figure 1:
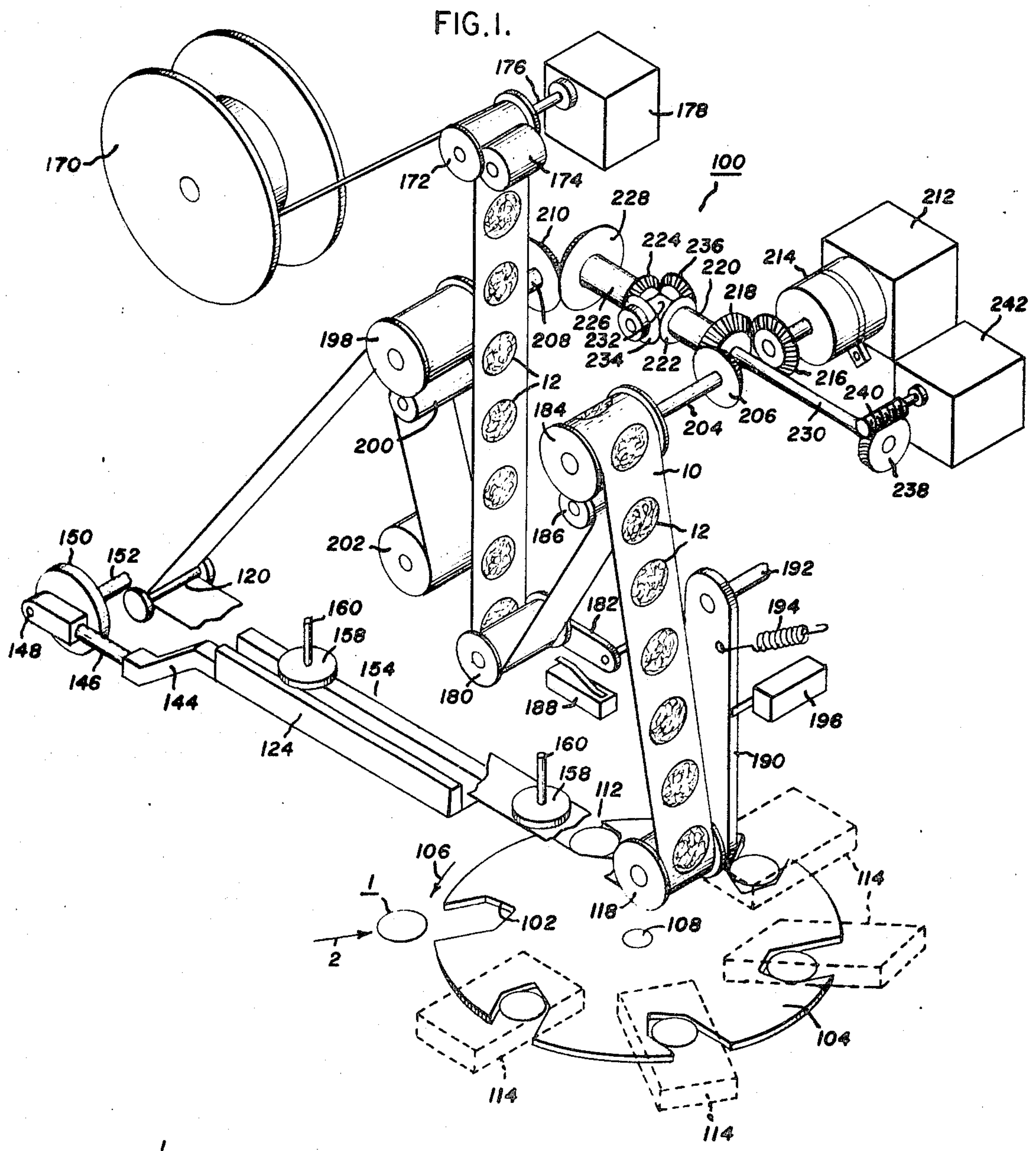
Figure 2:
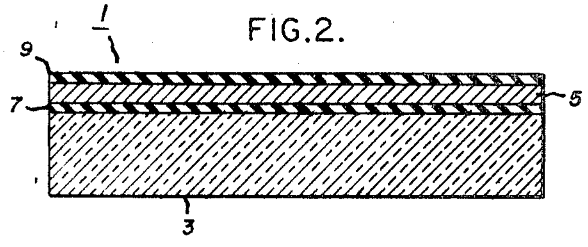
FIG. 2 is a schematic sectional view of a preferred substrate.

Referring to FIG. 1, substrates 1 are fed to my apparatus 100 as indicated by arrow 2. As shown in FIG. 2, each substrate 1 may consist of a support 3, such as a glass disc, to which a semiconductive wafer 5 may be bonded by an interposed adhesive layer 7. In practice the wafer may have formed therein one or a plurality of junctions according to techniques well understood in the art. A second adhesive layer 9 is adhered to the upper surface of the wafer—that is, the major surface of the wafer remote from the support. While a variety of elements may be utilized to form the substrate 1, in an exemplary embodiment the support is formed of a glass disc and the adhesive layers are formed of asphalt. The semiconductive wafer is typically a monocrystalline silicon wafer.

The substrates are positioned in peripheral slots 102 of a feed wheel 104. The slots 102 are regularly spaced around the periphery of the feed wheel. The slots are located to extend inwardly from the periphery of the feed wheel chordally rather than diametrically so that the peripheral extremity of each slot leads the interior extremity in the intended direction of rotation of the feed wheel. The feed wheel is noted to be incrementally rotated in the direction of the arrow 106 about the rotation shaft 108. The feed wheel may be mechanically or manually rotated. Positioning the slots with chordal rather than diametrical axes offers the advantage of causing the substrates to be urged toward the inner extremities of the slots during incremental rotation. To support the substrates in the slots the feed wheel is located on a table surface 110 (note FIG. 5). In incrementally rotating the feed wheel the substrates are brought beneath a plurality of peripherally spaced heaters 114. The heaters may be conventional radiant heaters. Where the adhesive layer 9 on the surface is asphalt, for example, the radiant heaters may be used to heat the adhesive to a temperature at which it is rendered tacky. For other types of adhesives other types of activating pretreatment structures may be substituted for one or more of the heaters. For many applications only one heating unit and one intermediate heating station may be required. After being incrementally passed beneath the heaters, the substrate arrives at the location 112, hereinafter referred to as the bonding station, at which the substrate is removed from the feed wheel. The table surface is provided with a slot 116 at the bonding station which is of a width less than that of the substrates, so that a portion of the lower surfaces of the substrates is exposed, yet the substrates are still supported by the table.

Figure 3:
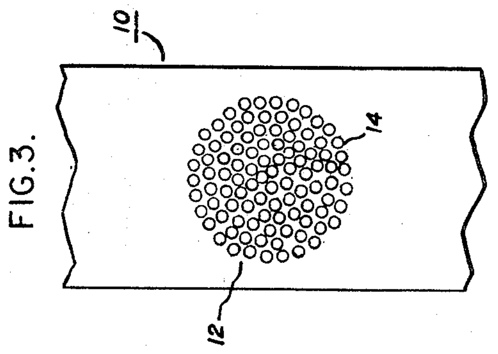
FIG. 3 is a plan view of segment of tape having a plurality of elements located thereon at a predetermined locus.

In order to adhesively bond elements to the substrates 1, I provide a continuous flexible tape 10 onto which a plurality of elements may be bonded at spaced loci 12. In a preferred form a plurality of elements 14 are clustered at each locus 12 on the tape in laterally spaced relation. This is shown in FIG. 3. Where the substrate includes a semiconductive wafer to be sub-divided by grit blasting, the elements 14 may take the form of metal resist discs which protect the underlying semiconductive material from erosion by the grit.

Figure 4:
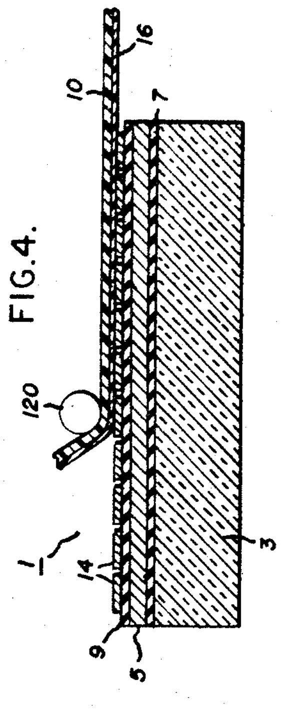
FIG. 4 is a schematic sectional view of the substrate, the tape, and the elements as they appear at the stripping station.
Figure 5:
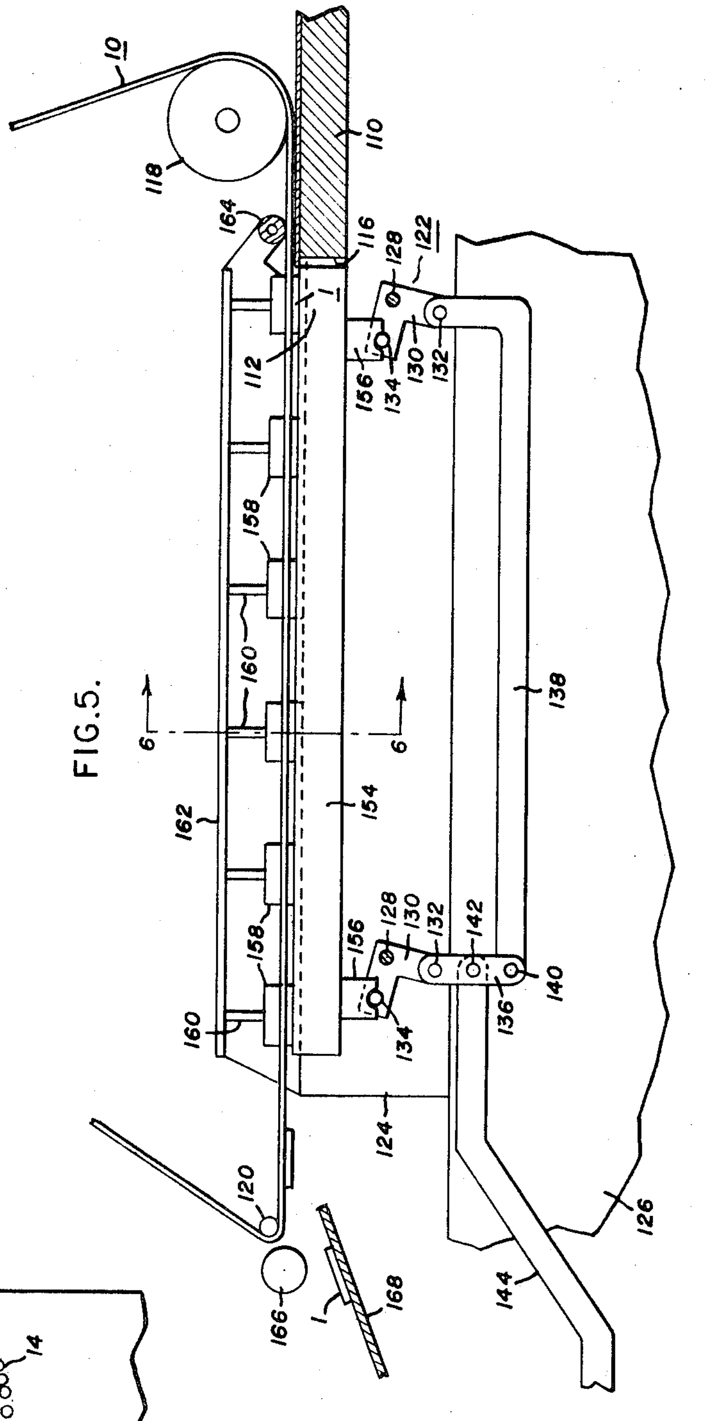
FIG. 5 is a sectional view of my apparatus showing the clamping mechanism between the bonding and stripping stations.

The structure for transfer of the elements from the tape to the substrate is best appreciated by particular reference to FIGS. 1, 4 and 5. The tape extends laterally under tension between a tensioning roller 118 and a stripping spindle 120. Initially a locus 12 on the tape is positioned in vertical alignment with the substrate at the bonding station 112. A clamping unit 122 as then utilized to clamp the elements at the locus 12 to the adhesive layer 9 of the substrate at the bonding station.

The clamping unit is comprised of a pair of rails 124 which are slidably positioned on a support surface 126 shown in FIG. 5, but omitted from FIG. 1. Pins 128 extend laterally between and join the rails. An offset linkage 130 is rotatably mounted by each pin and is provided with a pin 132 mounted by a lower arm and a pin 134 mounted by an arm normal to the lower arm. Connecting the pins 132 of the offset linkages is an equalizer linkage comprised of a link 136 depending from the pin 132 of one offset linkage and an L-shaped link 138 depending from the remaining pin 132. The links 136 and 138 are rotatably pinned together at 140. A pin 142 is carried by the link 136 midway between the pins 132 and 140. An actuator arm 144 is rotatably connected to the pin 142 and to a pitman 146. The pitman is connected by a rotatable pin connection 148 to an off-center location on a drive wheel 150 which is centrally attached to a drive shaft 152.

A clamp bar 154 is provided with legs 156 that are rotatably supported by the pins 134. Complementing the clamp bar are a plurality of spaced resilient pads 158. The pads are supported by rods 160 which depend from a support 162 which is in turn connected to and supported by one or both of the rails 124. The support 162 also rotatably mounts a roll 164 which assists the pads in restraining upward travel of the tape.

Figure 6:
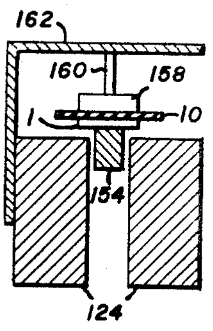
FIG. 6 is a sectional view taken along section line 6—6 in FIG. 5.
Figure 7:
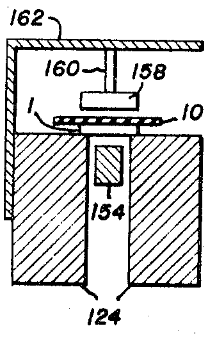
FIG. 7 is a sectional view similar to FIG. 6 showing the relationship of apparatus parts when the substrate is not clamped to the tape.

Operation of the clamping unit 122 can be best appreciated by considering the clamping bar 154 to be initially positioned beneath the bonding station 112 but below the upper surface of the rails 124 (note FIG. 7). Rotation of the drive shaft 152 and drive wheel 150 may then be utilized to pull the pitman 146 and actuator arm 144 away from the bonding station. This causes the offset linkage 130 to rotate clockwise (in FIG. 5) about the pins 128. Both of the offset arms are rotated equal amounts by reason of the pull distributing action of the equalizer linkage. Thus the clamp bar 154 is raised above the rails by the pins 134 an equal amount at each end. The clamp bar engages a portion of the undersurface of the substrates shown in FIG. 5, including the substrate initially located at the bonding station. The clamp bar urges the substrates upwardly into engagement with the aligned elements on the tape. Upward travel of the tape is limited by the resilient pads 158 which are fixedly mounted with respect to the rails. The raised position of the clam bar is shown in FIGS. 1, 5, and 6. As soon as clamping of the substrates is completed further rotation of the offset linkages is no longer possible. Accordingly, further lateral movement of the pitman away from the bonding station laterally slides the entire clamping unit, except for the drive wheel and drive shaft on the support surface 126. When the pitman reaches the position shown in FIG. 1—that is, its position furthest removed from the bonding station—further movement rather than pulling the actuator arm away from the bonding station pushes the actuator arm back toward the bonding station. This causes the offset linkages to be rotated counterclockwise in FIG. 5, thereby lowering the clamp bar below the upper surface of the rails in exactly a converse manner from that in which it was raised. Here again the equalizer linkage causes the clamp bar to be lowered uniformly. When further rotation of the offset linkages is not possible the entire clamping unit is slid back along the support surface to its original position. At this time the feed wheel has supplied another substrate to the bonding station and the next following tape locus is advanced to at least an approximate alignment with the bonding station.

From the foregoing description it is apparent that the clamping unit compressively engages the substrates with the aligned element associated with the tape and pulls the tape, elements, and substrates laterally away from the bonding station. A single pull by the clamping unit does not, however, move the substrates to the stripping spindle—i.e., the stripping station. In order to reach the stripping station the substrate is as shown repeatedly clamped and pulled laterally, although repeated clamping may not be necessary or desirable for many applications. In between the clamping engagement the substrates in transit between the bonding and stripping stations rest on the upper surfaces of the rails.

The stripping of the elements 14 from the tape is best illustrated in FIG. 4. As shown a thin layer of adhesive 16 may be present on the surface of the tape in order to attach the elements 14 thereto. The adhesive layer 16 is however, chosen to be less adherent to the elements than the adhesive layer 9. Accordingly, when the tape is drawn over the stripping spindle, the small radius of curvature of this spindle pulls the tape away from the elements 14 which are by this time firmly attached to the adhesive layer 9. As shown in FIG. 5, a blocking roll 166 may optionally be provided to prevent any tendency of the substrate to follow the tape over the stripping spindle. The substrates 1 with the elements attached thereto may be collected after stripping by catcher ramp 168.

In order to achieve bonding of the elements to the substrates in the manner desired it is necessary that the elements be firmly pressed against the adhesive layers 9, yet protected against excessive compression. The uniform manner in which the clamp bar is raised and lowered contributes to this result. Additionally, the resilience of the pads may be controlled to offer the proper combination of resilience and firmness.

Another requirement of acceptable bonding is that the tape must be held taut, yet free to move laterally. I accomplish this with a unique tape feeding and collecting arrangement which also contains provision for controllably moving the tape either forward or backward in order to achieve an exact alignment of the tape loci with the bonding station.

Referring to FIG. 1, the tape is supplied to my apparatus from a tape storage roll 170. The tape is passed over a tape feed roll 172. A compression roll 174 urges the tape against the feed roll for sufficient frictional engagement to permit a driving engagement. The tape feed roll is mounted by a shaft 176 controlled by a drive motor 178. The tape passes from the feed roll over a dancing roll 180 rotatably mounted by rotatable arm 182. The tape passes from the dancing roll to a first synchronous control roller 184. A compression roller 186 assures adequate frictional engagement of the tape with the first control roller.

Operation of the feeding mechanism to the first synchronous control roller is controlled automatically. The drive motor 178 normally drives the tape feed roll 172 to pull tape from the tape storage roll 170 and increase the tape length between the first synchronous control roller 184 and the tape feed roller. As the tape length increases, the dancing roll 180 is translated downwardly by gravity causing the arm 182 to be rotated counterclockwise. After a predetermined length of tape is paid out, the rotatable arm engages the switch 188 to shut off the motor 178 and stop additional tape feed. Thus, an adequate, but not excessive, amount of tape is always available to the first synchronous control roller. In the preferred form the elements 14 are on the tape at the time it is received from the tape storage roll.

The tape passes from the first synchronous control roller to the tensioning roller 118. The tensioning roller is rotatably mounted to one end of a rotatable arm 190 which is rotatably positioned at its opposite extremity by a support pin 192. A spring 194 is attached to the rotatable arm to bias the arm toward counterclockwise rotation about the pin 192. A switch 196 is mounted for engagement and actuation by the rotatable arm when the rotatable arm moves in a counterclockwise direction through a predetermined angle of rotation. The tape leaving the stripping spindle is passed over a second synchronous control roller 198. A compression roll 200 cooperates with the second control roller to assure adequate frictional engagement between the second control roller and the tape. Tape leaving the second control roller may be taken up on a collector spindle 202 or simply discarded.

I provide a unique mechanical control arrangement which permits the first and second control rollers to be used to permit lateral transport of the tape with a fixed amount of tension applied thereto. My mechanical arrangement also permits the loci on the tape to be accurately aligned with the bonding station. Further, my mechanism permits a predetermined tension level to be automatically maintained on the tape.

Figure 8:
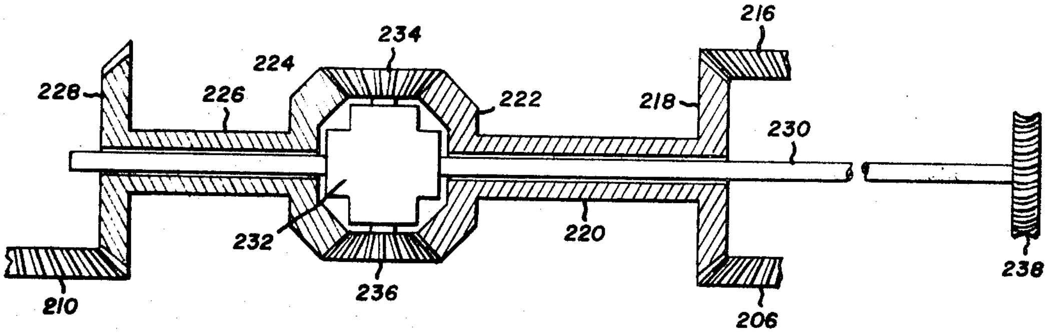
FIG. 8 is a sectional detail of a portion of the tape feed and collection portions of my apparatus.

The structure permitting this control over the tape is best illustrated by reference to FIGS. 1 and 8. The first synchronous control roller is driven by a shaft 204 having a bevel gear 206 attached thereto. The second synchronous control roller is driven by a shaft 208 having a bevel gear 210 attached thereto. In order to drive the bevel gears 206 and 210 in synchronous relation a reversible motor 212 is connected through a clutch and brake unit 214 to a drive bevel gear 216. The drive bevel gear is connected through a first intermediate bevel gear 218 to drive the bevel gear 206 in the opposite direction. The first intermediate bevel gear is connected through an integral hollow shaft 220 to a second intermediate bevel gear 222. A third intermediate bevel gear 224, which may be identical to bevel gear 222, is connected through a hollow shaft 226 to a fourth intermediate bevel gear 228, which may be identical to bevel gear 218. The fourth intermediate bevel gear meshes with the bevel gear 210. A shaft 230 extends through and supports the hollow shafts. The shaft carries a spider 232 thereon which rotatably supports epicyclic gears 234 and 236. The epicyclic gears mesh with the second and third intermediate bevel gears. Accordingly, the bevel gear 210 is rotated by the drive bevel gear 216 in the same direction therewith and in a direction opposite to the direction of rotation of the bevel gear 206. The shaft 230 is also connected to a worm gear 238 which meshes with a worm 240 driven by motor 242.

In operation of the tape positioning and tensioning apparatus, should the length of the tape between the first and second control rollers 184 and 198 exceed a predetermined maximum, the spring 194 will rotate the rotatable arm 190 counterclockwise until it actuates the switch 196. The actuated switch will activate the motor 242. This will cause the shaft 230 to be rotated through the worm 240 and worm gear 238. Rotation of the shaft rotates the spider 232 driving the epicyclic gears 234 and 236. This causes the bevel gear 224, hollow shaft 226, and bevel gear 210 to be driven so that control roller 198 is driven to take up the excess tape. The brake unit 214, however, prevents the control roller 184 from turning. As the tape length is reduced, rotatable arm 190 is rotated clockwise against the biasing force of the spring 194 to disengage the switch and to shut off the motor 242. Hence, control of the tape length between the control rollers is automatically maintained within controllable limits. Alignment of the tape is achieved by selectively actuating the motor 212 which rotates both control rollers in the same direction. Inasmuch as the control rollers are oppositely wound, tape is fed to one control roller while tape is collected by the other control roller. Since the motor 212 is reversible, the tape may be fed in either direction.

The tape storage roll, the winding and tensioning mechanism, the control rollers, the collection spindle, the pins for the rotatable arms, the compression rolls, and the switches can all be positioned in the relationship shown in FIG. 1 by the utilization of a support chassis or other suitable supporting structure. The supporting structures may be formed in any of a variety of ways which will be readily apparent to those having ordinary skill in the art. Accordingly no detailed description of the mounting structure for these elements is considered necessary or desirable.

While I have described my invention in terms of placing resist disc clusters onto adhesive semiconductive wafer surfaces, it is appreciated that my invention is generally applicable to the transfer of elements from a continuous tape to discrete substrates. For example, for a specific application it might be desirable to transfer clusters of discrete semiconductive elements from a tape mounting to a substrate mounting. While my apparatus and process are particularly suited to handling semiconductive elements and/or substrates, it is appreciated that semiconductive elements or wafers are not required for the practice of my invention. Instead of placing clusters of elements at each locus, only a single element may be positioned at each tape locus. It is intended that the scope of my invention be determined by reference to the following claims.

What I claim and desire to secure by Letters Patent of the United States is:

1. A process for mounting a plurality of discrete elements to discrete substrates comprising mounting the discrete elements at spaced loci along a continuous tape, positioning the tape so that it is held taut yet free to move between a bonding station and a stripping station, locating a discrete substrate at the bonding station, positioning at least one discrete element on the tape in alignment with the discrete substrate at the bonding station, clamping the discrete substrate into engagement with said at least one discrete element aligned therewith on the tape, laterally transporting said tape with the discrete substrate clamped thereto away from the bonding station, and stripping said at least one element with the discrete substrate attached from the tape.

2. A process according to claim 1 in which the substrates are preconditioned for adhesive attachment to the elements prior to location at the bonding station.

3. The process according to claim 1 in which the substrates are heated prior to location at the bonding station to render the surfaces to be engaged with the tape mounted elements adhesively tacky.

4. A process according to claim 1 in which the clamped tape and substrate are transported an incremental distance from the bonding station to a location mediate the bonding and stripping stations, unclamped, and thereafter clamped and transported an additional increment.

5. A process according to claim 1 in which clamping and transporting the tape brings a following locus on the tape into approximate alignment with the bonding station.

6. A process according to claim 1 additionally including the step of forming the substrate by mounting a semiconductor wafer on a support and providing an adhesive layer on the wafer surface remote from the support.

7. A process according to claim 1 in which the elements are mounted on the tape at the loci in spaced clusters.

References Cited

UNITED STATES PATENTS

| | | | |
|---|---|---|---|
| 3,371,001 | 2/1968 | Ettre | 156—234 |
| 3,458,376 | 7/1969 | Malik | 156—233 |
| 2,729,583 | 1/1956 | Sadowsky | 156—239 X |
| 3,554,832 | 1/1971 | Fischer | 156—229 |

ALFRED L. LEAVITT, Primary Examiner

R. A. DAWSON, Assistant Examiner

U.S. Cl. X.R.

156—230, 241, 247, 322, 541, 542